United States Patent [19]

Marsh et al.

[11] 3,786,362

[45] Jan. 15, 1974

[54] BALANCED OUTPUT OPERATIONAL AMPLIFIER

[75] Inventors: Douglas George Marsh, Freehold; Thomas Gerald Maxfield, New Shrewsbury, both of N.J.

[73] Assignee: Bell Telephone Laboratories, Incorporated, Murray Hill, Berkeley Heights, N.J.

[22] Filed: Feb. 7, 1972

[21] Appl. No.: 224,040

[52] U.S. Cl. .................................. 330/30 D, 330/17

[51] Int. Cl. .............................................. H03f 3/68

[58] Field of Search ....................... 330/69, 30 D, 40, 330/22, 27, 76, 96

[56] References Cited

UNITED STATES PATENTS 3,275,945 9/1966 Walker et al. .................... 330/30 D

*Primary Examiner*—Nathan Kaufman
*Attorney*—G. E. Murphy

[57] ABSTRACT

An operational amplifier which provides a balanced output signal and whose differential input stage utilizes active loads. A common mode signal is derived from the balanced output signal and used via a comparator and a feedback loop to control the operation of the active loads.

4 Claims, 3 Drawing Figures

INPUT STAGE

BALANCED OUTPUT OPERATIONAL AMPLIFIER

BACKGROUND OF THE INVENTION

This invention pertains to amplifier circuits and, more particularly, to operational amplifier circuits which provide a balanced output signal and use active loads in the differential input stage of the amplifier.

As is well known, a theoretical operational amplifier is characterized by infinite gain, infinite bandwidth, infinite input impedance, and zero output impedance. Although there is a high degree of idealization involved in this characterization of an amplifier, the performance of many commercially available amplifiers is close enough to the ideal to make them highly suitable in a multiplicity of applications. In general, an operational amplifier accepts two input signals and produces an output signal which is directly proportional to the difference of the input signals. Hence, amplifiers of this kind are often called difference or differential amplifiers. The overwhelming majority of operational amplifiers therefore produce what is known as an unbalanced or single-ended output signal, i.e., a unitary signal proportional to the difference of two applied input signals. However, in some systems there is a demand for an amplifier which provides a balanced output signal. Such an amplifier finds use, for example, in voice-frequency repeaters, single frequency signaling systems, and in channel bank circuits. In such applications, a differential or balanced output signal amplifier is almost a necessity. One of the primary advantages of using such an amplifier is that noise generated in system equipments is substantially reduced. In addition, with a balanced output signal, it is possible to drive a transmission line directly without the necessity of using a transformer. Thus, the inherent cost and large size of transformers may be negated.

In order to obtain high common mode rejection, high differential gain, and low power dissipation in the input stage of an operational amplifier, it is desirable to use transistor current sources as active loads, thereby eliminating the need for high valued resistors and large d.c. supply voltages. However, it is extremely difficult to properly bias these active loads by matching and other known techniques and still obtain a differential output signal from the input stage of the amplifier. Thus, a number of solutions have been proposed for properly adjusting the bias, i.e., operating currents, of the active loads of the differential input stage of an operational amplifier in order to insure that the active loads operate at the proper current level. One such system is disclosed in U. S. Pat. No. 3,440,554 issued to D. R. McGraw et al. on Apr. 22, 1969. In the circuit disclosed by McGraw et al., a plurality of feedback circuits are used to maintain proper biasing levels in the input stage. One of the difficulties associated with such an arrangement is the high degree of balance required by the feedback circuits in order that they properly cooperate to insure that the bias levels of the active loads are properly maintained. Another scheme is disclosed in U. S. Pat. No. 3,564,439 issued to T. N. Rao on Feb. 16, 1971. Rao discloses a circuit wherein a plurality of transistors, properly matched, are utilized to maintain constant currents in the various branches of the differential input stage of an operational amplifier. Reliance on the use of a plurality of closely matched transistors to insure proper biasing gives rise to practical difficulties.

It is therefore an object of this invention to accurately and efficiently achieve proper biasing of the active loads of the differential input stage of a balanced output operational amplifier.

SUMMARY OF THE INVENTION

This and other objects are achieved, in accordance with the principles of this invention, by a common mode signal feedback arrangement. More particularly, in a balanced or differential output signal amplifier having an input stage differentially connected for receiving input signals, first and second transistors serve as active loads for the input stage. Apparatus, including a second stage of amplification, responsive to the output signals generated by the input stage is utilized to develop a common mode signal which is equal to the arithmetic average of the two output signals. This common mode signal is compared in a differential amplifier with a predetermined reference signal to develop a control signal which in turn determines the currents of the active loads of the input stage. Accordingly, an optimum balance is obtained between the current required by the second stage, the current flowing from the differentially connected input stage, and the current flowing into the active loads of the differential input stage.

DETAILED DESCRIPTION

Figure 1:
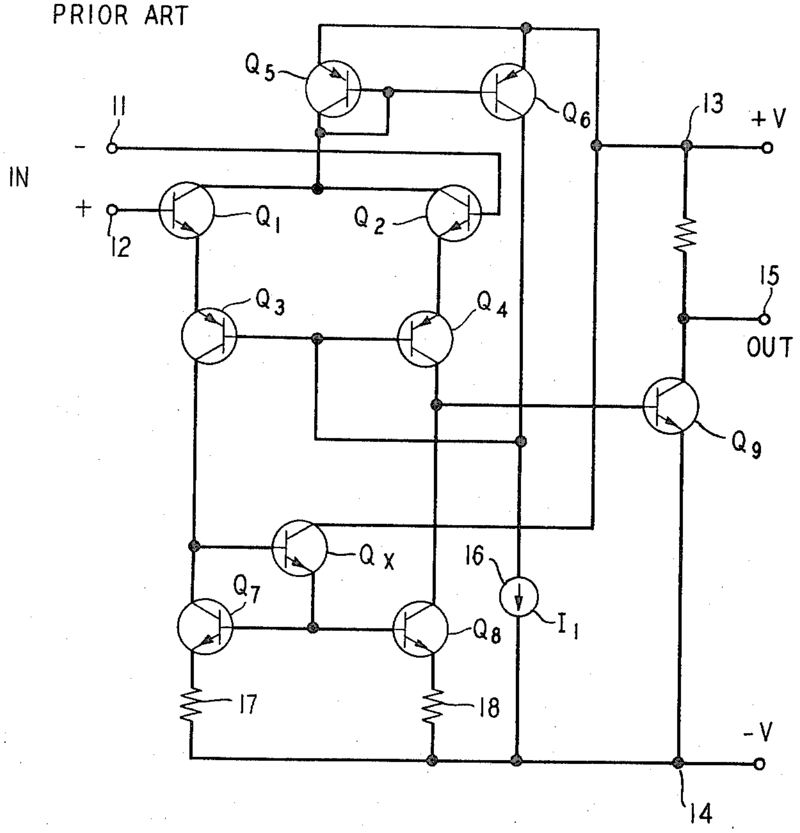
FIG. 1 PRIOR ART
FIG. 1 depicts a prior art operational amplifier which provides an unbalanced output signal.

The prior art circuit of FIG. 1 is responsive to input signals differentially applied to terminals 11 and 12 and provides a single-ended (unbalanced) output signal on terminal 15. Transistors $Q_1$, $Q_2$, $Q_3$, and $Q_4$ serve as a composite high quality PNP differential amplifier input stage. Transistors $Q_1$ and $Q_2$ are high gain NPN devices that require low input bias current and present a high input resistance. Transistors $Q_3$ and $Q_4$ supply the PNP features of the differential amplifier. The bias currents for transistors $Q_1$ to $Q_4$ are maintained by constant current source 16. Transistors $Q_5$ and $Q_6$ serve as a controlled current source for driving the collectors of transistors $Q_1$ and $Q_2$. Transistors $Q_7$ and $Q_8$ serve as active loads for transistors $Q_3$ and $Q_4$, respectively. $Q_7$ and $Q_8$ are essentially current sources and provide a very high load impedance. Common emitter transistor output amplifier $Q_9$ has its base terminal connected to the common collector terminal junction of transistors $Q_4$ and $Q_8$ and provides a single-ended output signal at its collector terminal. Transistor $Q_X$, connected between the collector and base terminals of transistor $Q_9$, balances the effect of transistor $Q_9$ on the input differential stage and improves the common mode signal rejection of the input circuit. Transistors $Q_1$ and $Q_2$ are matched, as are transistors $Q_3$, $Q_4$, and transistors $Q_7$ and $Q_8$, respectively. Since transistors $Q_7$ and $Q_8$ have the same base-to-emitter voltage, and are matched transistors, their collector currents are substantially the same. The current flowing into the collector of transistor $Q_8$ is equal to the collector current of transistor $Q_4$ minus the current flowing into the base of transistor $Q_9$. Also, the collector current of transistor $Q_7$ is equal to the collector current of transistor $Q_3$ minus the base current of transistor $Q_X$. Since the output is single-ended, i.e., does not provide a differential or balanced output, transistor $Q_X$ may be used as a mechanism for insuring that the collector currents of transistors $Q_7$ and $Q_8$ are maintained at the proper level relative to the collector currents of $Q_3$ and $Q_4$. For example, if the collector current of transistor $Q_7$ decreases for some reason, more current would flow into the base of transistor $Q_X$ increasing the emitter currents of transistors $Q_7$ and $Q_8$, which in turn would increase their collector currents, thus compensating for any decrease in collector current. Thus, a fine balance is obtained between the base current flowing into a subsequent output stage, the currents required by the active loads $Q_7$ and $Q_8$, and the collector currents of transistors $Q_3$ and $Q_4$.

In many applications, a balanced or differential output is required. In such a case, the mechanism described for insuring that the current drawn by active transistor loads $Q_7$ or $Q_8$ is exactly equal to the current provided by transistors $Q_3$ or $Q_4$, less the base current drawn by the second stage, is no longer operable, since transistor $Q_X$ must be eliminated. Imperfect matching of the above-described currents results in either saturation or cutoff of the second or output stage. For example, if transistor $Q_7$ or $Q_8$ draws too much current, then less base current is available for the second stage and cutoff is likely. On the other hand, if transistor $Q_7$ or $Q_8$ draws too little current, too much current is driven into the succeeding second stage causing it to go into saturation. In a completely balanced amplifier, both transistors $Q_7$ and $Q_8$ must act as input stage loads; transistor $Q_X$ may not be used since it terminates one of the desired output signals. Thus, some means must be provided to adjust the currents of transistors $Q_7$ and $Q_8$ in a balanced output amplifier while maintaining their utility as active loads for transistors $Q_3$ and $Q_4$.

Figure 2:
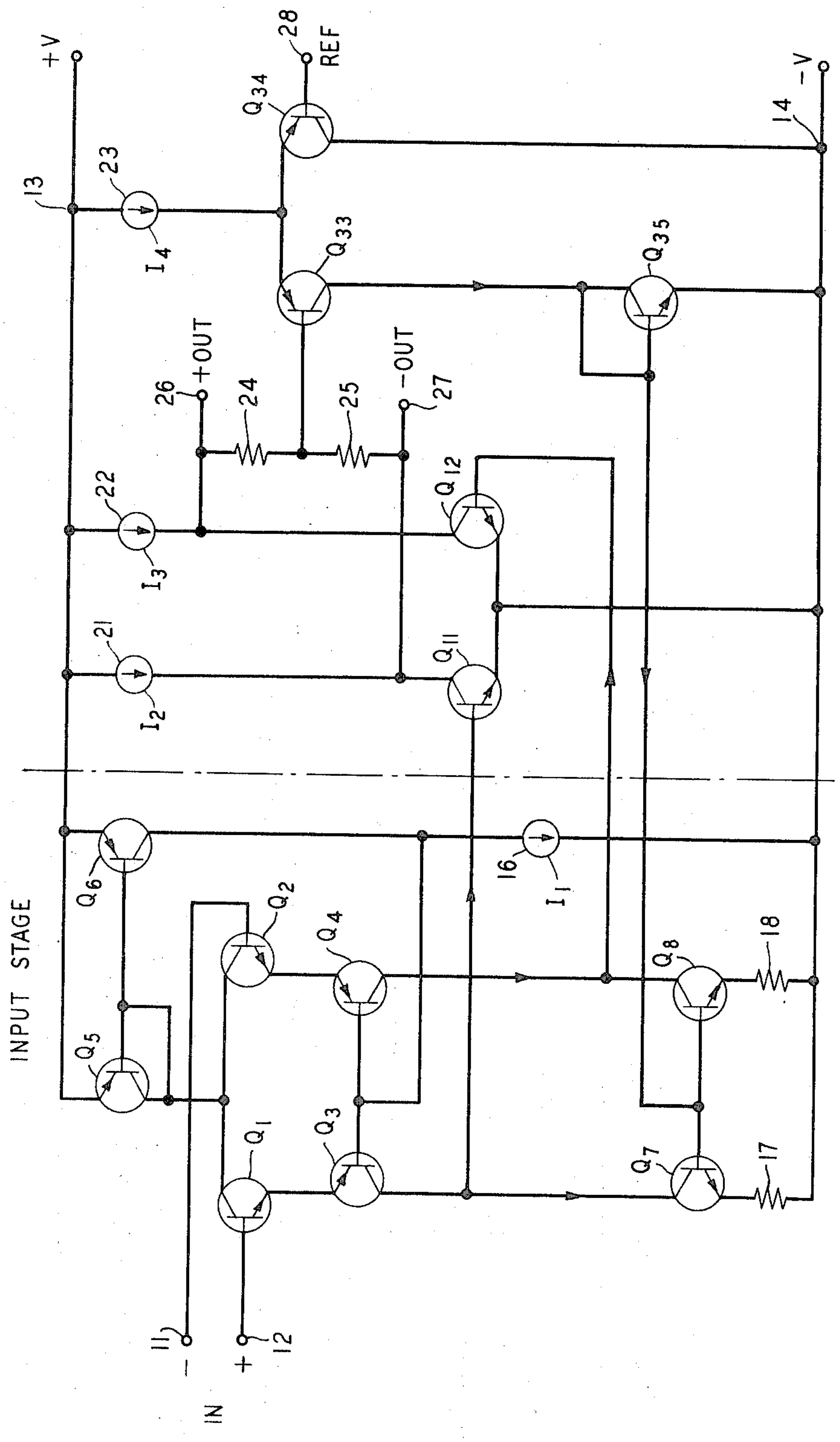
FIG. 2 depicts the operational amplifier of this invention wherein a balanced output signal is provided and a common mode signal is derived from the balanced output signal for controlling the operating levels of the active loads of the differential input stage.

One manner in which this is accomplished, in accordance with the principles of this invention, is depicted by the circuitry of FIG. 2. In FIG. 2, circuit components identical to those of FIG. 1 have been identically identified. An applied differential input signal appearing at terminals 11 and 12 is supplied to the base terminals of transistors $Q_1$ and $Q_2$. The collector terminals of transistors $Q_1$ and $Q_2$ are connected in common to the collector terminal of transistor $Q_5$. The emitter terminals, respectively, of transistors $Q_1$ and $Q_2$, are connected to the emitter terminals of transistors $Q_3$ and $Q_4$, which have their base terminals connected in common. Constant current source 16 draws current from the bases of transistors $Q_3$ and $Q_4$, and also from the collector of transistor $Q_6$ which has its emitter terminal connected to terminal 13. A source of positive potential +V is connected to terminal 13. The base terminal of transistor $Q_6$ is connected to the base terminal of transistor $Q_5$ and the base and collector terminals of transistor $Q_5$ are commonly connected. The emitter terminal of transistor $Q_5$ is connected to terminal 13. The collector terminals of transistors $Q_3$ and $Q_4$ are connected, respectively, to the collector terminals of transistors $Q_7$ and $Q_8$, which in turn have their emitter terminals returned via resistors 17 and 18 to terminal 14. A source of negative potential −V is connected to terminal 14. The base terminals of transistors $Q_7$ and $Q_8$ are connected together. The differential output signal of the first stage is available at the collectors of transistors $Q_7$ and $Q_8$ and is supplied to the base terminals, respectively, of transistors $Q_{11}$ and $Q_{12}$, which have their emitter terminals connected in common to terminal 14. The collectors of transistors $Q_{11}$ and $Q_{12}$ are respectively connected to terminal 13 via active current source loads 21 and 22 of any well-known configuration. An amplified balanced output signal is provided at output terminals 26 and 27. Serially connected between terminals 26 and 27 are resistors 24 and 25 which preferably have equal resistive values. The signal appearing at the midpoint connection of these two resistors is supplied to the base terminal of transistor $Q_{33}$ which has its emitter terminal connected to the emitter terminal of transistor $Q_{34}$. Current source 23, connected to terminal 13, supplies current to the common emitter connection of transistors $Q_{33}$ and $Q_{34}$. A reference signal is supplied to the base terminal of transistor $Q_{34}$ via terminal 28. The collector terminal of transistor $Q_{34}$ is returned to the negative voltage supply via terminal 14 and the collector terminal of transistor $Q_{33}$ is connected to the collector terminal of transistor $Q_{35}$. The collector and base terminals of transistor $Q_{35}$ are connected to the joint base terminal connection of transistors $Q_7$ and $Q_8$ and the emitter terminal of transistor $Q_{35}$ is returned via terminal 14 to the negative voltage supply. A conventional diode may, in certain circumstances, be substituted for transistor $Q_{35}$, if so desired.

Considering the operation of the circuit of FIG. 2, transistors $Q_1$ and $Q_2$ act as input emitter follower amplifiers supplying the differential common base stage comprising transistors $Q_3$ and $Q_4$. The differential signal appearing between the collector terminals of transistors $Q_3$ and $Q_4$ is proportional to the amplified difference of the input signals applied at terminals 11 and 12. Common emitter transistors $Q_{11}$ and $Q_{12}$ provide a second stage of amplification. A balanced, i.e., differential, output signal is supplied by the collector terminals of transistors $Q_{11}$ and $Q_{12}$ to the output terminals 26 and 27. Transistors $Q_7$ and $Q_8$ are active collector loads for the common base transistor pair $Q_3$ and $Q_4$. Constant current source 16 establishes the desired bias currents for the input stage and may be of any well-known type. The current of source 16, $I_1$, is equal to the sum of the base currents from transistors $Q_3$ and $Q_4$ and the collector current of transistor $Q_6$. Since transistors $Q_5$ and $Q_6$ are connected in a well-known current source configuration, their collector currents are equal. Thus, the quiescent collector currents of transistors $Q_3$ and $Q_4$, which are related to the collector current of transistor $Q_5$, may be readily determined from straightforward algebraic equations and are essentially established by constant current source 16. Since the collector currents of $Q_3$ and $Q_4$ are substantially invariant, it is essential that the active collector loads, transistors $Q_7$ and $Q_8$, be self-adjusting so that their collector currents do not countervail the established currents emanating from the collectors of transistors $Q_3$ and $Q_4$. The manner in which this is accomplished will be discussed hereinafter. The common base transistor pair consisting of lateral PNP transistors $Q_3$ and $Q_4$ provides d.c. level shifting as well as voltage gain. In addition, the high base-emitter breakdown voltages of transistors $Q_3$ and $Q_4$ make it possible to apply large differential signals at the amplifier input terminals 11 and 12. As mentioned before, the differential signal appearing at the collectors of transistors $Q_3$ and $Q_4$ is applied to the base terminals respectively of transistors $Q_{11}$ and $Q_{12}$ and an amplified version thereof appears at terminals 26 and 27. Of course, more than one stage of amplification may be used, if so desired.

In accordance with the principles of this invention, a common mode signal feedback circuit is utilized to insure proper biasing of the input stage active loads, transistors $Q_7$ and $Q_8$. Operation of the feedback circuit can be best understood by an example. Assume that the collector currents of transistors $Q_3$ and $Q_4$, which are fixed by constant current source 16 as previously discussed, are insufficient to supply proper second stage base drive and the currents required by transistors $Q_7$ and $Q_8$. The consequent shortage of base current drive in the second stage, i.e., transistors $Q_{11}$ and $Q_{12}$, causes both transistors to begin to turn off and the voltage at both collector output terminals accordingly becomes more positive. The common mode output signal, defined as the average of the two output voltages appearing at terminals 26 and 27 thus becomes more positive. This common mode signal voltage appears at the common terminal connection of resistors 24 and 25 which are bridged across the output terminals 26 and 27 of the amplifier. The common mode signal is applied to the base terminal of transistor $Q_{33}$ and is compared in the differentially connected transistor pair $Q_{33}$ and $Q_{34}$ to a reference potential which is supplied to the base terminal 28 of transistor $Q_{34}$. This reference potential may be either internally derived, e.g., a connection to ground, or an external reference signal. Thus, as the common mode output voltage becomes more positive, the collector current of transistor $Q_{33}$ decreases as does the collector current of diode connected transistor $Q_{35}$. The current in transistor $Q_{35}$ controls the current in transistors $Q_7$ and $Q_8$. This control function is essentially the same as that exhibited by the conventional current source transistor pair $Q_5$, $Q_6$, i.e., the collector current of one transistor controls the collector current of the other current source connected transistor. In this case, the collector currents of both transistors $Q_7$ and $Q_8$ are controlled. It therefore follows that the currents flowing into the collectors of transistors $Q_7$ and $Q_8$ must be directly related to the current flowing from the collector of transistor $Q_{33}$ into the collector of transistor $Q_{35}$. Thus, the collector currents of transistors $Q_7$ and $Q_8$ decrease as the collector current of transistor $Q_{35}$ decreases. The smaller collector currents required by transistors $Q_7$ and $Q_8$ thus make available more base drive current for the second stage comprising transistors $Q_{11}$ and $Q_{12}$. The input stage load current has therefore been corrected and the common mode output voltage of transistors $Q_{11}$ and $Q_{12}$ returns to the reference level. Since the feedback loop has high gain at d.c., the common mode output voltage need not differ from the reference voltage by more than a very small amount to provide the necessary correction. The common mode feedback signal feedback arrangement of this invention, in addition to solving a fundamental biasing problem, also proves beneficial to the common mode and power supply rejection ratios.

Figure 3:
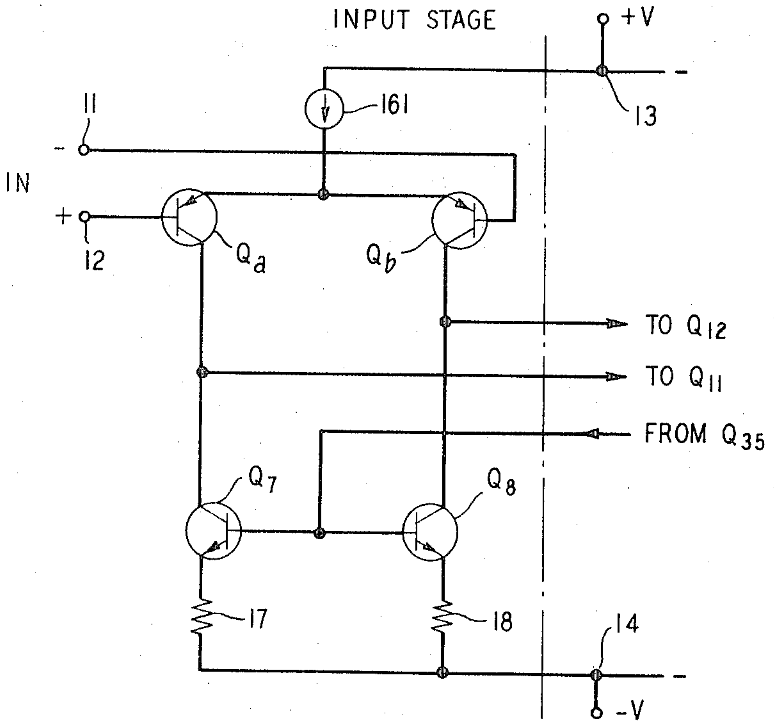
FIG. 3 depicts an alternative embodiment of the differential input stage of the amplifier of FIG. 2.

FIG. 3 depicts an alternative embodiment of the input stage of the circuit of FIG. 2 which may be used in the practice of this invention. Like components to those used in FIG. 2 have been identically identified and the portion of the circuit of FIG. 2, not shown, is identical to that of FIG. 2. Only two differentially connected transistors, $Q_a$ and $Q_b$, are used in the input stage of this embodiment. Input signals are applied via terminals 11 and 12 to the respective base terminals of transistors, $Q_b$ and $Q_a$. A constant current source 161 supplies current directly to the emitters of transistors $Q_a$ and $Q_b$ and thereby controls the collector currents of transistors $Q_a$ and $Q_b$. The current source 161 is returned to a positive voltage supply via terminal 13.

The balanced output operational amplifier of this invention may be fabricated on a beam-leaded chip using sealed junction, bipolar integrated circuit technology. The differential output of the amplifier makes it capable of developing peak-to-peak output voltages well in excess of the total power supply voltage. This capability, in addition to the input characteristics, frequence response, and high gain normally associated with operational amplifiers, makes the amplifier ideally suited to a variety of applications in voice-frequency repeaters, transmission terminals, and electronic switching systems. Of course, various different equivalent npn-pnp transistor configurations may be employed in different applications.

What is claimed is:

1. In a balanced output signal operational amplifier having a differentially connected input stage for receiving applied input signals, said input stage biased by a constant current source and having its output terminals respectively connected to the collector terminals of first and second active load transistors, the base terminals of said first and second transistors connected in common and the emitter terminals of said first and second transistors connected, respectively, by an impedance element to a terminal of fixed potential, the improvement comprising:

means responsive to the signals developed at said output terminals of said input stage for supplying a balanced output signal;

means responsive to said balanced output signal for developing a signal representative of the arithmetic average of said balanced output signal;

means for comparing said representative signal with a predetermined reference signal to develop a control signal;

and means for supplying said control signal to the base terminals of said first and second transistors.

2. In a balanced output signal operational amplifier having an input stage differentially connected for receiving applied input signals, said input stage biased by a constant current source and having its output terminals respectively connected to the collector terminals of first and second load transistors, the base terminals of said first and second transistors connected in common and the emitter terminals of said first and second transistors connected, respectively, by an impedance element to a terminal of fixed potential, the improvement comprising:

means responsive to the signals developed at said input stage output terminals for supplying a balanced output signal;

means responsive to said balanced output signal for developing a signal representative of the arithmetic average of said balanced output signal;

third and fourth transistors having their emitter terminals commonly connected to a source of constant current, the collector terminal of said fourth transistor connected to said terminal of fixed potential, the base terminal of said fourth transistor supplied with a predetermined reference signal;

a fifth transistor having its base and collector terminals commonly connected to the collector terminals of said third transistor and the base terminals of said first and second transistors, the emitter terminal of said fifth transistor connected to said terminal of fixed potential;

and means for supplying said representative average signal to the base terminal of said third transistor.

3. In a balanced output signal amplifier having first and second input transistors differentially connected for receiving input signals applied to the base terminals of said transistors, the emitter terminals of said transistors connected in common to a first source of fixed potential by a first constant current source, the collector terminals of said transistors respectively connected to the collector terminals of third and fourth transistors, the base terminals of said third and fourth transistors connected in common, and the emitter terminals of said third and fourth transistors connected, respectively, by a resistive element to a second source of fixed potential, the improvement comprising:

means responsive to the signals developed at said first and second transistor collector terminals for supplying a balanced output signal;

means responsive to said balanced output signal for developing a signal representative of the arithmetic average of said balanced output signal;

fifth and sixth transistors having their emitter terminals commonly connected by a second constant current source to said first source of fixed potential, the collector terminal of said sixth transistor connected to said second source of fixed potential and the base terminal of said sixth transistor connected to a source of reference potential;

a seventh transistor having its base and collector terminals commonly connected to the collector terminal of said fifth transistor and the common base terminal of said third and fourth transistors, the emitter terminal of said seventh transistor connected to said second source of fixed potential;

and means for supplying said representative average signal to the base terminal of said fifth transistor.

4. In a differential output signal amplifier having first and second input transistors differentially connected for receiving input signals applied to the base terminals of said transistors, the emitter terminals of said transistors connected in common to a first source of fixed potential by a constant current source, the collector terminals of said transistors respectively connected to the collector terminals of third and fourth transistors, the base terminals of said third and fourth transistors connected in common, and the emitter terminals of said third and fourth transistors connected, respectively, by an impedance element to a second source of fixed potential, the improvement comprising:

means responsive to the signals developed at said first and second transistor collector terminals for supplying a differential output signal;

means responsive to said differential output signal for developing a signal representative of the arithmetic average of said differential output signal;

fifth and sixth transistors having their emitter terminals commonly connected to said first source of fixed potential, the collector terminal of said sixth transistor connected to said second source of fixed potential and the base terminal of said sixth transistor connected to a source of reference potential;

a seventh transistor having its base and collector terminals commonly connected to the collector terminal of said fifth transistor and the common base terminal of said third and fourth transistors, the emitter terminal of said seventh transistor connected to said second source of fixed potential;

and means for supplying said representative average signal to the base terminal of said fifth transistor.

* * * * *